(12) United States Patent
Mary et al.

(10) Patent No.: US 8,994,951 B2
(45) Date of Patent: Mar. 31, 2015

(54) FRAME ELEMENT OF A LASER GYROSCOPE COMPRISING A SUBSTRATE COMPRISING MOBILE IONS AND AN ELECTRODE

(71) Applicant: Thales, Neuilly sur Seine (FR)

(72) Inventors: Alexandre Charles Lucien Mary, Chatellerault (FR); Bertrand Morbieu, St. Cyr sur Lorie (FR)

(73) Assignee: Thales, Courbevoie (FR)

( * ) Notice: Subject to any disclaimer, the term of this patent is extended or adjusted under 35 U.S.C. 154(b) by 93 days.

(21) Appl. No.: 13/688,733

(22) Filed: Nov. 29, 2012

(65) Prior Publication Data
US 2013/0141732 A1 Jun. 6, 2013

(30) Foreign Application Priority Data
Dec. 2, 2011 (FR) ................................. 11 03681

(51) Int. Cl.
*G01C 19/64* (2006.01)
*H05K 1/02* (2006.01)
*G01C 19/66* (2006.01)

(52) U.S. Cl.
CPC ............ *H05K 1/0296* (2013.01); *G01C 19/661* (2013.01)
USPC ........................................ 356/459

(58) Field of Classification Search
CPC ...... G01C 19/56; G01C 19/66; G01C 19/661; H05K 1/02; H05K 1/0296
USPC ................. 356/459, 469; 73/504.01, 504.02; 174/250, 256
See application file for complete search history.

(56) References Cited

U.S. PATENT DOCUMENTS

| | | | |
|---|---|---|---|
| 5,098,189 A | 3/1992 | vonBieren | |
| 5,432,604 A | 7/1995 | Canfield et al. | |
| 5,856,995 A | 1/1999 | Morris | |
| 6,025,914 A * | 2/2000 | Ford et al. | ...................... 356/459 |
| 6,072,580 A * | 6/2000 | Barnes et al. | ................... 356/459 |
| 6,714,580 B2 * | 3/2004 | Ecklund et al. | .................. 372/94 |

FOREIGN PATENT DOCUMENTS

JP 2000183152 A * 6/2000
WO WO 0135055 A1 * 5/2001

* cited by examiner

*Primary Examiner* — Michael A Lyons
(74) *Attorney, Agent, or Firm* — Michael J. Donohue; Davis Wright Tremaine LLP

(57) ABSTRACT

The invention pertains to a frame element of a laser gyroscope comprising a substrate comprising mobile ions and an electrode fixed to the said substrate, comprising at least one electrically conducting element, connected electrically to the said electrode, and furnished with at least one distal part integrated into the said substrate and exhibiting at least one tip and/or at least one groove, forming at least one blind hole and/or at least one groove in the said substrate, of shape corresponding to that of the said distal part or parts, so as to obtain a tip effect.

16 Claims, 1 Drawing Sheet

FRAME ELEMENT OF A LASER GYROSCOPE COMPRISING A SUBSTRATE COMPRISING MOBILE IONS AND AN ELECTRODE

FIELD OF THE INVENTION

The present invention relates to a frame element, made in a substrate comprising mobile ions, of a laser gyroscope. This substrate may be of ceramic or metallic type but also of any type of material comprising mobile ions. It applies to the domain of equipment whose substrate possesses mobile ions and wherein the displacement of these ions towards certain zones may embrittle these said zones.

BACKGROUND OF THE INVENTION

In order to avoid this displacement of ions and the resulting embrittlement, it is known to place an insulating barrier between the structure containing the mobile ions and the zones to be protected. In order to make this insulating barrier, the use of a dielectric barrier is known. Such a device exhibits the defect of requiring, during the fabrication process, the deposition of an insulating barrier.

It is also known to use an electrode making it possible to attract the ions towards a substrate zone dedicated for this purpose. This electrode must be of a different potential from that of the anode or the cathode so as to attract the ions. Such a device exhibits the defect of requiring the addition of another voltage source of a different potential from that used by the electrode or electrodes already present in the laser gyroscope.

SUMMARY OF THE INVENTION

The present invention is aimed notably at remedying these problems by proposing a device making it possible to protect the sensitive zones of a laser gyroscope from the accumulation of ions while avoiding the addition of a protective layer or of a new source at a different potential from the sources used by the anode or the cathode.

Hence, there is proposed, according to one aspect of the invention, a frame element of a laser gyroscope comprising a substrate exhibiting mobile ions, and an electrode fixed to the said substrate, characterized in that it comprises at least one electrically conducting element, connected electrically to the said electrode, and furnished with at least one distal part integrated into the said substrate and exhibiting at least one tip and/or at least one groove, forming at least one blind hole and/or at least one groove in the said substrate, of shape corresponding to that of the said distal part or parts, so as to obtain a tip effect.

This device therefore affords the advantage of allowing the attraction of the mobile ions by the distal part comprising at least one cone and/or at least one groove. This attraction of the mobile ions results from the higher potential at the level of the tip or of the groove, caused by the physical phenomenon known by the name tip effect.

According to one embodiment of the invention at least one tip exhibits a radius of curvature of a value less than the square of the greatest length of the zone of the substrate to be protected, divided by the minimum distance separating the said tip and the zone of the substrate to be protected.

According to one embodiment of the invention at least one groove exhibits a radius of curvature of a value less than the square of the greatest length of the zone of the substrate to be protected, divided by the minimum distance separating the said groove and the zone of the substrate to be protected.

In the case of a tip-shaped surface, the radius of curvature at a point is the radius of a sphere tangent to the said point at the said surface. Indeed, a tip, on account of the atomic nature of matter, is never perfectly pointed at its end, but exhibits an ellipse shape. The radius of curvature is then the radius of the circle tangent to the end of the ellipse.

In the case of a groove-shaped surface, the radius of curvature at a point is the radius of a cylinder whose height is parallel to the direction of the groove tangent to the said point at the said surface.

The greatest length of a zone corresponds to the maximum length that a segment connecting two points situated at the periphery of the zone can have.

This technical characteristic makes it possible to adapt the size of the distal part, in particular the size of the groove or of the tip, to the shape of the frame of the laser gyroscope and thus to allow the integration of the said distal part as close as possible to the elements to be protected.

According to one embodiment of the invention the said tip or tips or the said groove or grooves are at a distance from the zone of the substrate to be protected of less than half the greatest length of the laser gyroscope frame.

The greatest length of a frame corresponds to the maximum length that a segment connecting two points situated at the periphery of the frame can have.

These two technical characteristics make it possible to optimize the location of the elements serving to attract the alkaline ions.

Advantageously the substrate comprises ZERODUR® material.

According to one embodiment of the invention the said electrically conducting element or elements and the said distal part or parts are adapted to be integrated at the surface of the said laser gyroscope frame substrate.

According to one embodiment of the invention the said electrically conducting element or elements and the said distal part or parts are adapted to be integrated inside the said laser gyroscope frame substrate.

These two technical characteristics make it possible to adapt the location of the distal part, in particular the location of the groove or of the tip, to the shape of the frame of the laser gyroscope and thus to allow the integration of the distal part as close as possible to the elements to be protected.

Advantageously the laser gyroscope contains a frame element as defined above.

BRIEF DESCRIPTION OF THE DRAWINGS

The invention will be better understood and other advantages will become apparent on reading the detailed description given by way of non-limiting example and with the aid of the figures among which.

DETAILED DESCRIPTION

The present invention relates to a device making it possible to attract mobile ions present in a substrate, whose displacement is caused by an electric field created by a plurality of electrodes, towards dedicated and non-brittle zones of the substrate.

Figure 1:
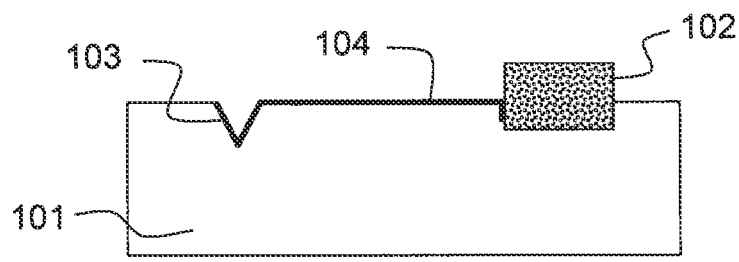
FIG. 1 schematically represents an embodiment of the device, according to one aspect of the invention.

The device such as presented in FIG. 1 comprises a laser gyroscope frame 101 made in a substrate possessing mobile ions. This substrate can for example be made from the material known by the name ZERODUR®. ZERODUR® is a non-porous, inorganic glass ceramic material manufactured by the Schott Company. The laser gyroscope comprises an electrode 102. This electrode makes it possible to sustain the laser beam of the laser gyroscope, but its role may The laser gyroscope comprises an electrode 102. This electrode makes be different in other applications. A negative effect of the electric field produced by the electrode or electrodes will be to cause the displacement of the ions present in the substrate. To channel this displacement of the ions towards a dedicated and non-brittle zone of the substrate a distal part 103 is added to the electrode. This distal part 103 is connected to the electrode 102 by an electrically conducting element 104. This conducting element may be made by way of a conducting adhesive, by metallic deposition or by any other equipment making it possible to conduct the electricity between the electrode and the distal part. The distal part exhibits at least one tip 105 (see FIG. 3) and/or at least one groove 106 (see FIG. 2). The distal part can comprise a mixture of tips and grooves and these tips and grooves may be sited at various places in or on the surface of the substrate so as to protect several zones of the substrate. Through the physical process known by the name of tip effect, these elements make it possible to increase the potential of the distal part with respect to the potential of the electrode. This increase in potential will then attract the ions. In order for this increase in potential to be optimal it is preferable that the radius of curvature at the end of the tip or along the groove be less than $M^2/d$ (M being the greatest length of the zone of the substrate to be protected and d being the minimum distance between the tip and the zone of the substrate to be protected). These tips or grooves form moreover a blind hole or a groove in the substrate, of shape corresponding to that of the said distal part. In order to improve the performance of the ion trapping system it is preferable to place the cones or the grooves of the distal part at a distance of less than L/2 (in this equation L is the greatest length of the frame of the laser gyroscope) from the zone to be protected.

Figure 2:
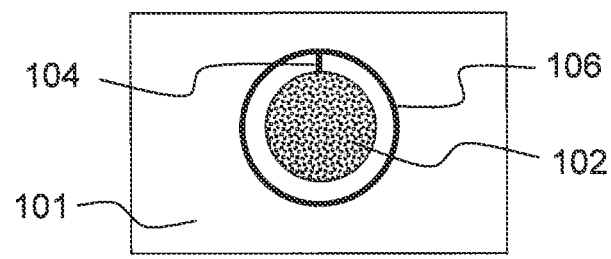
FIG. 2 schematically represents an embodiment of the device in which the distal part comprises a groove FIG. 3 schematically represents an embodiment of the device in which the distal part comprises several tips FIG. 4 schematically represents an embodiment of the device in which the distal part is integrated into the frame of the laser gyroscope
Figure 3:
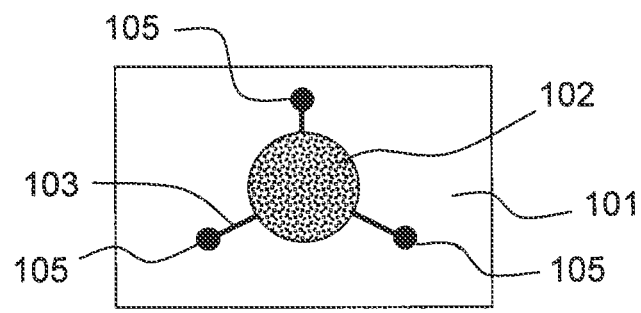
Figure 4:
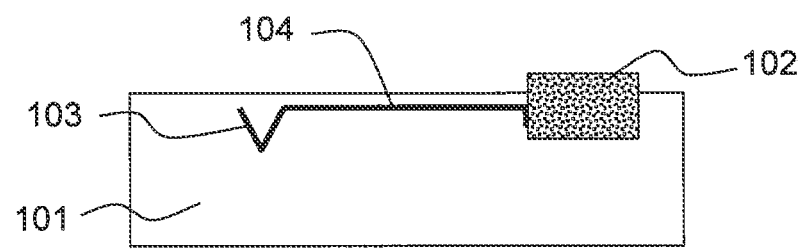

FIGS. 2 to 4 present various embodiments of the device of FIG. 1 in which the location and the shape of the trapping device are adapted to the shape of the frame of the gyroscope and to the zone to be protected. FIG. 2 presents an embodiment of the device in which the trapping system comprises a circular groove 106. FIG. 3 presents an embodiment of the device of FIG. 1 in which the trapping system comprises three tips 105. FIG. 4 presents an embodiment of the device which the trapping system is integrated into the substrate.

The invention claimed is:

1. A frame element for use in a laser gyroscope, the frame element comprising:
    a substrate comprising mobile ions,
    an electrode fixed to the substrate;
    at least one electrically conducting element connected electrically to the electrode; and
    at least one distal part integrated into the substrate and connected to the at least one electrically conducting element, the at least one distal part comprising at least one groove formed in the substrate and/or at least one tip comprising at least one blind hole formed in the substrate, the at least one distal part being configured to cause a tip effect that attracts the mobile ions to the at least one distal part.

2. The frame element of claim 1, wherein, the substrate comprises a zone to be protected having a maximum length;
    the at least one distal part comprises a groove having a radius of curvature;
    a minimum distance separates the groove and the zone; and
    the radius of curvature is less than a square of the maximum length divided by the minimum distance.

3. The frame element of claim 1, wherein, the substrate comprises a zone to be protected having a maximum length;
    the at least one distal part comprises a tip having a radius of curvature;
    a minimum distance separates the tip and the zone; and
    the radius of curvature is less than a square of the maximum length divided by the minimum distance.

4. The frame element of claim 3, wherein the radius of curvature of the tip is a first radius of curvature;
    the at least one distal part comprises a groove having a second radius of curvature; and
    the second radius of curvature is less than a square of the maximum length divided by a minimum distance separating the groove and the zone of the substrate to be protected.

5. The frame element of claim 1, wherein the substrate comprises a zone to be protected;
    the frame element comprises a maximum length; and
    each of the at least one tip and/or the at least one groove of the at least one distal part is located at a distance from the zone that is less than half the maximum length of the frame element.

6. The frame element of claim 1, wherein the substrate comprises ZERODUR® material.

7. The frame element of claim 1, wherein the substrate has a surface; and
    the at least one electrically conducting element and the at least one distal part are adapted to be integrated at the surface of the substrate.

8. The frame element of claim 1, wherein the at least one electrically conducting element and the at least one distal part are adapted to be integrated inside the substrate.

9. A laser gyroscope containing a frame element comprising:
    a substrate comprising mobile ions;
    an electrode fixed to the substrate;
    at least one electrically conducting element connected electrically to the electrode; and
    at least one distal part integrated into the substrate and connected to the at least one electrically conducting element, the at least one distal part comprising at least one groove formed in the substrate and/or at least one tip comprising at least one blind hole formed in the substrate, the at least one distal part being configured to attract the mobile ions, by the tip effect, to thereby increase a first electrical potential of the at least one distal part with respect to a second electrical potential of the electrode.

10. The laser gyroscope of claim 9, wherein the substrate comprises a zone to be protected having a maximum length;
    the at least one distal part comprises a groove having a radius of curvature;
    a minimum distance separates the groove and the zone; and
    the radius of curvature is less than a square of the maximum length divided by the minimum distance.

11. The laser gyroscope of claim 9, wherein the substrate comprises a zone to be protected having a maximum length;
    the at least one distal part comprises a tip having a radius of curvature;
    a minimum distance separates the tip and the zone; and the radius of curvature is less than a square of the maximum length divided by the minimum distance.

12. The laser gyroscope of claim 11, wherein the radius of curvature of the tip is a first radius of curvature;
the at least one distal part comprises a groove having a second radius of curvature; and
the second radius of curvature is less than a square of the maximum length divided by a minimum distance separating the groove and the zone of the substrate to be protected.

13. The laser gyroscope of claim 9, wherein the substrate comprises a zone to be protected;
the frame element comprises a maximum length; and
each of the at least one tip and/or the at least one groove of the at least one distal part is located at a distance from the zone that is less than half the maximum length of the frame element.

14. The laser gyroscope of claim 9, wherein the substrate comprises ZERODUR® material.

15. The laser gyroscope of claim 9, wherein the substrate has a surface; and
the at least one electrically conducting element and the at least one distal part are adapted to be integrated at the surface of the substrate of the frame element of the laser gyroscope.

16. The laser gyroscope of claim 9, wherein the at least one electrically conducting element and the at least one distal part are adapted to be integrated inside the substrate of the frame element of the laser gyroscope.

\* \* \* \* \*